United States Patent [19]

Nakamura et al.

[11] Patent Number: 5,266,828
[45] Date of Patent: Nov. 30, 1993

[54] IMAGE SENSORS WITH AN OPTICAL FIBER ARRAY

[75] Inventors: Tetsuro Nakamura; Takahiko Murata, both of Osaka; Shinji Fujiwara, Minoo, all of Japan

[73] Assignee: Matsushita Electric Industrial Co., Ltd., Osaka, Japan

[21] Appl. No.: 884,826

[22] Filed: May 18, 1992

Related U.S. Application Data

[62] Division of Ser. No. 739,562, Aug. 21, 1991, Pat. No. 5,138,145, which is a division of Ser. No. 476,483, Jun. 4, 1990, Pat. No. 5,065,006.

[30] Foreign Application Priority Data

| Oct. 14, 1988 | [JP] | Japan | 63-259777 |
| Oct. 15, 1988 | [JP] | Japan | 63-259711 |
| Apr. 4, 1989 | [JP] | Japan | 1-85434 |
| Apr. 4, 1989 | [JP] | Japan | 1-85437 |
| Apr. 14, 1989 | [JP] | Japan | 1-95709 |
| May 24, 1989 | [JP] | Japan | 1-130841 |

[51] Int. Cl.$^5$ ............................................. H01L 27/14
[52] U.S. Cl. .................................. 257/432; 257/435; 257/434; 257/443; 385/49; 385/70
[58] Field of Search ............... 257/432, 434, 443, 435, 257/448, 447, 99, 98, 100, 49; 385/116, 123, 49, 40, 70, 128; 361/416

[56] References Cited

U.S. PATENT DOCUMENTS

| 3,969,751 | 7/1976 | Drukaroff et al. | 257/435 |
| 4,232,219 | 11/1980 | Yamamoto et al. | 257/432 X |
| 4,316,204 | 2/1982 | Inagaki et al. | 257/432 |
| 4,630,355 | 12/1986 | Johnson | 437/8 |
| 4,678,273 | 7/1987 | Vilhelmsson | 385/128 |
| 4,786,607 | 11/1988 | Yamazaki et al. | 437/170 |
| 4,806,496 | 2/1989 | Suzuki et al. | 437/8 |
| 5,005,029 | 4/1991 | Fuse | 257/99 X |
| 5,037,780 | 8/1991 | Fujimoto et al. | 437/212 |
| 5,039,620 | 8/1991 | Yamazaki et al. | 437/3 |
| 5,071,787 | 12/1991 | Mori et al. | 437/212 |
| 5,079,190 | 1/1992 | Mihara | 437/8 |
| 5,155,777 | 10/1992 | Angelopoulos et al. | 385/49 X |

FOREIGN PATENT DOCUMENTS

58-218164 12/1983 Japan.

Primary Examiner—William Mintel
Attorney, Agent, or Firm—Panitch, Schwarze, Jacobs & Nadel

[57] ABSTRACT

This invention relates to an image sensor with photo sensors (13). An object thereof is to simplify mounting operation of an image sensor chip (12) provided with the photo sensors (13). In order to accomplish this object, according to this invention, the photo sensors (13) and electrodes (15) are disposed on the underside of the image sensor chip (12). The image sensor chip (12) is bonded to the upper side of a transparent substrate (18) by means of a transparent photo-setting type insulating resin (16), so that the electrodes (15) come into contact with circuit conductor layers (17) disposed on the upper side of the transparent substrate (18). With the above-mentioned construction, since fine metal wire (75) by which the electrodes (15) and the circuit conductor layers (17) are connected to each other is not required, mounting operation can be simplified.

3 Claims, 8 Drawing Sheets

IMAGE SENSORS WITH AN OPTICAL FIBER ARRAY

CROSS-REFERENCE TO RELATED APPLICATION

The present application is a division of U.S. patent application Ser. No. 07/739,562, filed Aug. 21, 1991, entitled "Method for Producing Image Sensors with Current Flow Into Chip and With Simplified Chip Mounting", now U.S. Pat. No. 5,138,145 which in turn is a division of U.S. patent application Ser. No. 07/476,483, filed Jun. 4, 1990, entitled "Image Sensor With Simplified Chip Mounting", now U.S. Pat. No. 5,065,006.

TECHNICAL FIELD

This invention relates to an image sensor and a method of manufacturing the same.

BACKGROUND ART

Figure 7A:
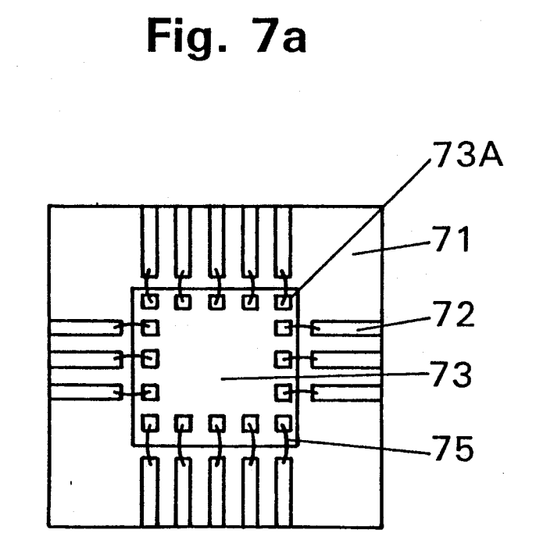
FIGS. 7(a) and 7(b) are, respectively, a plan view and a front sectional view of a conventional arrangement.
Figure 7B:
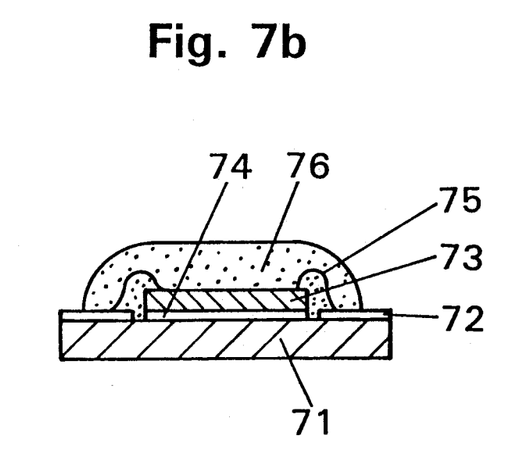

Conventional image sensors are typically of the type in which, as FIGS. 7(a) and 7(b) show, an image sensor chip 73 is fixedly mounted through the intermediary of a conductive adhesive 74 on an opaque substrate 71 formed with circuit conductor layers 72. An electrode 73A of the image sensor chip 73 is connected individually with the circuit conductor layers 72 by wire bonding using fine wire of a metal such as that of gold or aluminum. The assembly is sealingly covered with a transparent mold resin material 76. A plurality of photo sensors (not shown) are arranged on sides of individual electrodes 73A of the image sensor chip 73.

One drawback of such an image sensor is that the electrodes 73A have to be connected individually with the circuit conductor layers 72 using fine metal wire 75, which involves very complicated wiring work. Another drawback is that the arrangement of the image sensor makes it difficult to adapt the electrodes 73A to be arranged at a reduced pitch.

DISCLOSURE OF THE INVENTION

Therefore, it is an object of the invention to provide an image sensor which can be fabricated without involving complicated wiring work using fine metal wire and with improved efficiency, and which is of such construction as can be readily adapted to needs for reduced electrode pitch.

In order to accomplish this object, according to the invention there is provided an image sensor comprising a transparent substrate having circuit conductor layers formed thereon, and an image sensor chip having electrodes and photo sensors arranged on the underside thereof, the image sensor chip being in adhesion bond with the top surface of the substrate by means of a photo-setting type insulating resin.

According to the above arrangement, the electrodes of the image sensor chip are individually positioned directly on the circuit conductor layers formed on the transparent substrate, resulting in simplified wiring work and provides good adaptability to needs for reduced-pitch electrode arrangement.

BEST MODE FOR CARRYING OUT THE INVENTION

A first embodiment of the invention will now be described with reference to the accompanying drawings.

Figure 1A:
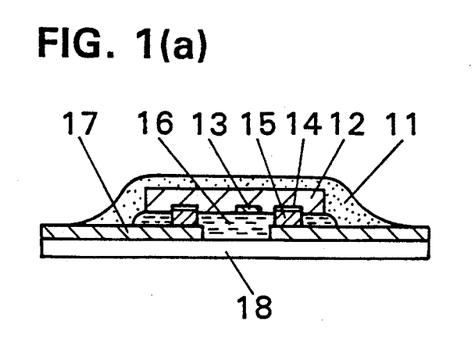
FIGS. 1(a) and 1(b) are, respectively, a side sectional view and a front sectional view of a first embodiment of the invention.
Figure 1B:
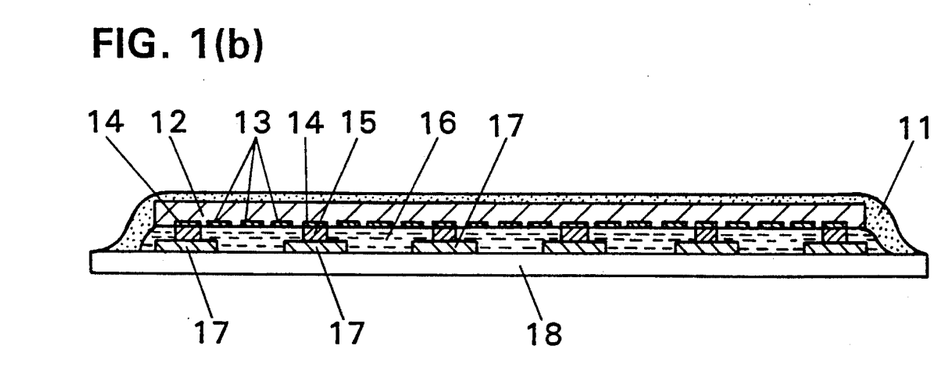

FIGS. 1(a) and 1(b) illustrate an image sensor of the first embodiment of the invention.

Numeral reference 11 designates a protective layer for protecting an image sensor chip 12. Numeral reference 13 designates a plurality of photo sensors provided on the underside of the image sensor chip 12. Numeral reference 14 designates a plurality of electrodes provided on the underside of the image sensor chip 12. Numeral reference 15 designates a protrusion-like conductor electrode provided on each of the electrodes 14 of the image sensor chip 12. Numeral reference 16 designates a transparent photo-setting type insulating resin for setting the image sensor chip 12 in place on the circuit conductor layers 17 formed on the upper side of the transparent substrate 18.

A method of manufacturing the image sensor of the above described construction will be explained.

A monocrystalline silicon substrate (wafer) provided thereon with photo sensors 13, such as photo transistors or photo diodes, and access circuits (not shown), such as CCD, MOS, or bipolar integrated circuits, is first fabricated by employing a semiconductor process. An electrode 15 of gold or the like material is then formed by plating or otherwise on a portion of each electrode 14 through the intermediary of a barrier metal, such as Ti/Pd, to the thickness of several μm. Then, the monocrystalline silicon substrate is cut to size by high-precision dicing to obtain a semiconductor image sensor chip 12. Subsequently, circuit conductor layers 17 are formed on a transparent substrate 18, e.g., a glass substrate, using noble metal, such as gold or silver-platinum, and by screen printing or film casting and photolithography. A predetermined amount of a transparent photo-setting type insulating resin 16 of the acrylic type is applied in position on the transparent substrate 18 by screen printing or by using a dispenser or the like, and the image sensor chip 12 is placed on the resin so applied, with the electrodes 15 downside. Then, the image sensor chip 12 is subjected to pressure applied from above and, meanwhile, the transparent photo-setting type insulating resin 16 is irradiated with ultraviolet light through the transparent substrate 18 below until it is finally set, whereupon mounting of the image sensor chip is completed. A resin material, such as silicon, is applied over the so mounted image sensor chip by using a dispenser or the like to form a protective layer 11.

This image sensor operates in such a manner that the photo sensors 13 detect optical information through the transparent substrate 18 and transparent photo-setting type insulating resin 16 and convert same into an electric signal.

A second embodiment of the invention will be described with reference t relevant drawings.

Figure 2A:
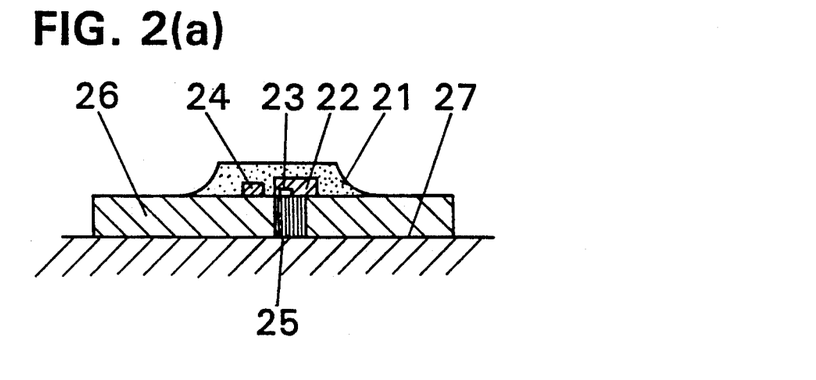
FIGS. 2(a), 2(b) and 2(c) are, respectively, a side sectional view, a front sectional view, and a partially cut away plan view of a second embodiment of the invention.
Figure 2B:
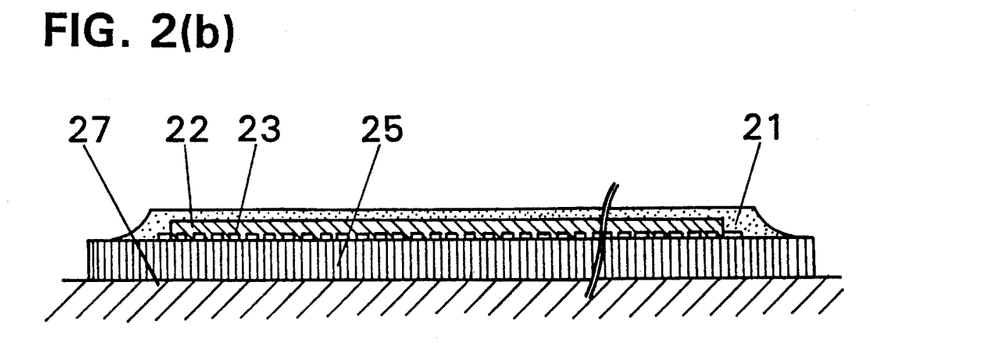
Figure 2C:
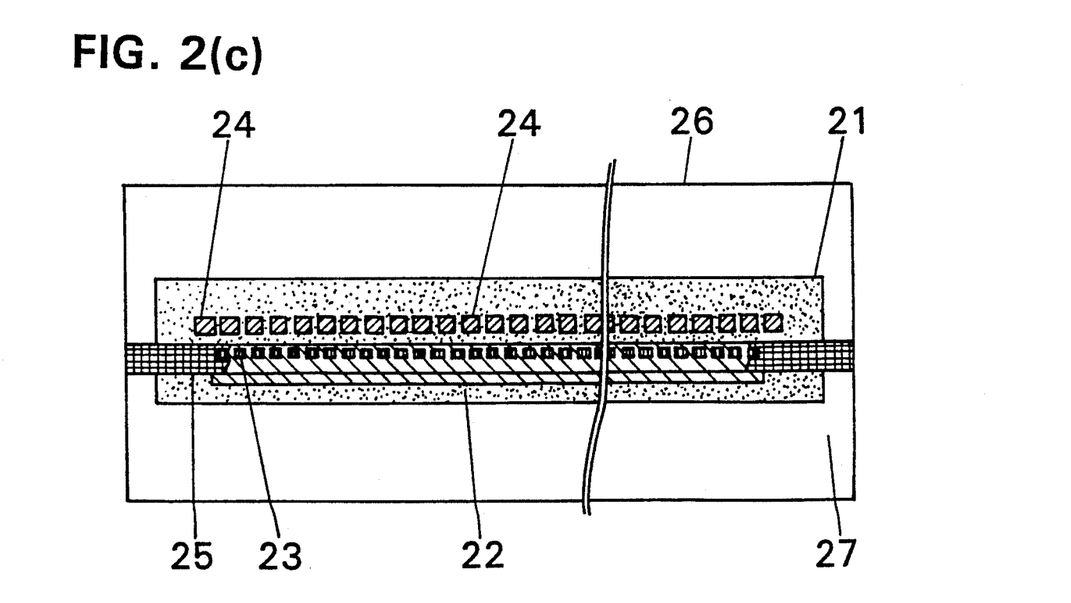

FIGS. 2(a), 2(b) and 2(c) illustrate an image sensor of the second embodiment.

Numeral reference 21 designates a protective film for protecting an image sensor chip 22 and light-emitting diodes 24. A plurality of photo sensors 23 are provided on the underside of the image sensor chip 22. Light-emitting diodes 24, which are exemplary of a light source, are mounted likewise on the upper side of the transparent substrate 26. Numeral reference 25 designates an optical fiber array (exemplary of lenses) formed on a portion of the transparent substrate 26 corresponding to the photo sensors 23. Numeral reference 27 designates a document original to be read.

Operation of the image sensor with the above-mentioned structure will be described.

Light from the light-emitting diodes 24 that represent a light source illuminates the original 27 through the transparent substrate 26. Optical information from the original 27 is introduced to the photo sensors 23 by the optical fiber array 25 embedded in the transparent substrate 26 such that each of its constituent optical fibers is sufficiently smaller in diameter that the corresponding photo sensor 23, without any crosstalk trouble. As an alternative to the optical fiber array 25 which serves as lenses, micro-lenses may be used, or lenses may be provided in the form of waveguides formed in the transparent substrate 26.

As is apparent from the above description, the embodiments shown in FIGS. 1 and 2 require no wiring work using fine metal wire. This results in simplified mounting operation and permits adaptation to needs for reduced-pitch arrangement. Further, the embodiments involve no possible disconnection of such metal wire due to mechanical vibrations, which fact contributes to improved reliability.

Figure 3A:
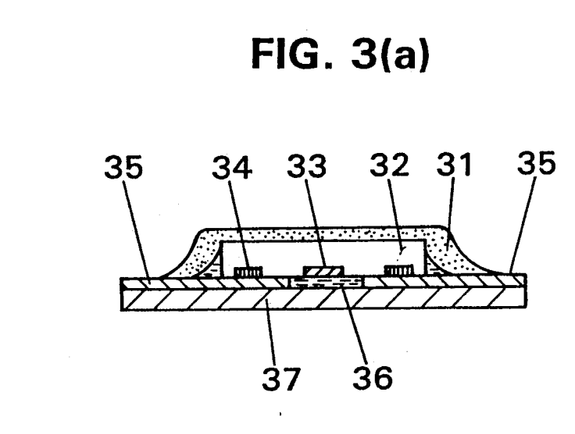
FIGS. 3(a) and 3(b) are, respectively, a side sectional view and a front sectional view of a third embodiment of the invention.
Figure 3B:
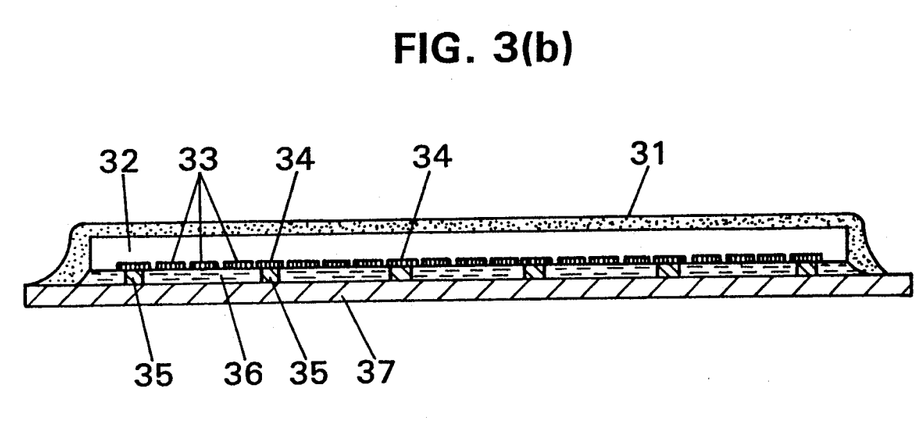

FIG. 3 illustrates, by way of example, a method of manufacturing the image sensor of the invention.

In FIGS. 3(a) and 3(b), numeral reference 31 designates a protective layer which covers an image sensor chip 32 for protection thereof. Numeral reference 33 designates a plurality of photo sensors provided on the underside of the image sensor chip 32; and numeral reference 34 designates a plurality of electrodes provided on the underside of the image sensor chip 32. Numeral reference 35 designates circuit conductor layers formed on the upper side of a transparent substrate 37. Numeral reference 36 designates a transparent photo-setting type insulating resin used for mounting the image sensor chip 32 on the transparent substrate 37.

The manner of mounting the image sensor chip in position in the fabrication of the image sensor constructed as described above will be explained.

A plurality of image sensor chips each having photo sensors 33, such as phototransistors or photodiodes, access circuits (not shown), such as CCD, MOS, or bipolar IC's, and electrodes 34 arranged on a monocrystalline substrate (wafer) are fabricated by employing a semiconductor process. The monocrystalline silicon substrate is cut by high-precision dicing into discrete image sensor chips 32. Next, circuit conductor layers 35 are formed on a transparent substrate 37, e.g., a glass substrate, using noble metal, such as gold or silver-platinum, and by screen printing or film casting and photolithography. For this purpose, a portion of each circuit conductor layer 35 to which a corresponding electrode 34 of the image sensor chip 32 is directly connected is dimensioned smaller in width than the width of the corresponding electrode 34 of the image sensor chip 32 (i.e., not more than 200 $\mu$m), and has a height of the order of several $\mu$m.

A prescribed amount of a transparent photo-setting type insulating resin 36 of the acrylic type is applied in position on the transparent substrate 37 by screen printing or by using a dispenser or the like, and the image sensor chip 32 is placed on the resin so applied, with the electrodes 34 downside. Then, pressure is applied to bring the electrodes 34 into secure bond with the corresponding circuit conductor layers 35. In this case, simultaneously, voltage is externally applied through the circuit conductor layers 35 in order to ensure that the image sensor chip 32 operates in a normal manner. When it is determined that operation is normal, the transparent photo-setting type insulating resin 36 is irradiated with ultraviolet light through the transparent substrate 37 while pressure is continuously applied, until the resin is finally set. If, in this case, operation is found abnormal, the mounting procedure is repeated without causing the resin to set, or the image sensor chip 32 is replaced with a new one, followed by same process of mounting as above described. In this manner, a plurality of image sensor chips 32 are mounted in accurate linear alignment. Finally, a resin material, such as silicon, is applied over the aligned image sensor chips by using a dispenser or the like to form a protective layer 31 thereon. An image sensor has now been completed.

This image sensor operates in such a manner that the photo sensors 33 receive optical information through the transparent substrate 37 and transparent photo-setting type insulating resin 36 and convert same into an electric signal.

As is apparent from the above description, according to the embodiment shown in FIG. 3, the mounting area with respect to the image sensor chip can be reduced because no wiring work using fine metal wire is required; and in the event of any mounting error being found in the process of mounting or immediately upon the image sensor chip mounted being found to be defective, mounting work correction or image sensor chip replacement, as the case may be, can readily be performed.

Figure 4:
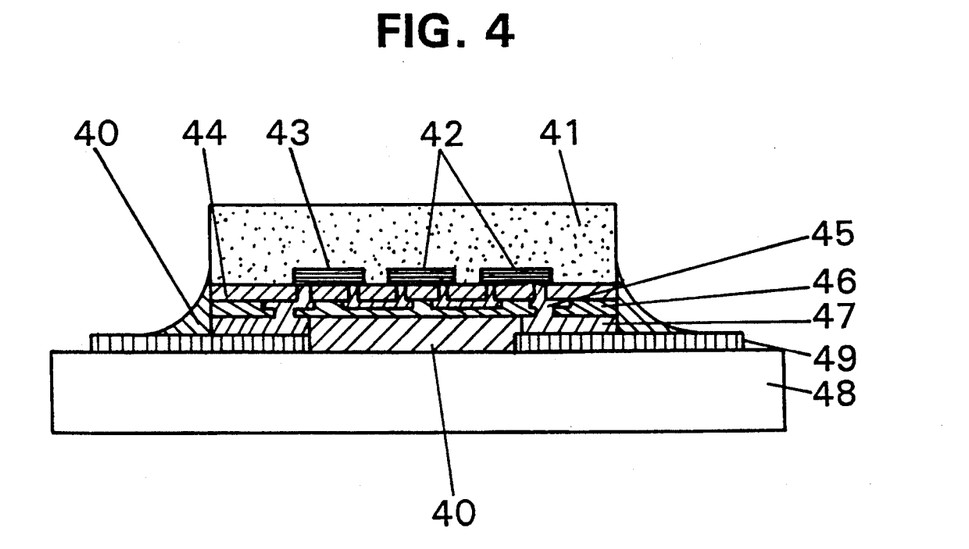
FIG. 4 is a side sectional view of a fourth embodiment of the invention.

FIG. 4 illustrates a fourth embodiment of the invention. In FIG. 4, numeral reference 41 designates an image sensor chip; 42 designates elements, such as active elements or passive elements, formed in the image sensor chip 41; 43 designates photo sensors; 45 designates circuit conductor layers which electrically connect between the elements 42 on one hand and the photo sensors 43 on the other hand; 44 designates an insulating layer; 46 designates a protective layer; and 47 designates electrodes formed on the surface of the protective layer 46. Numeral reference 48 designates a transparent substrate for mounting; 49 designates circuit conductor layer formed on the upper side of the substrate; and 40 designates a transparent photo-setting type insulating resin. The image sensor of the above construction will be further described.

Electrodes 47 are formed on the surface of a protective layer 46 of a semiconductor chip 41 fabricated by a semiconductor process and formed with photo sensors 43, elements 42, and circuit conductor layers 45. Next, circuit conductor layers 49 are formed on a transparent substrate 48. A prescribed amount of a transparent photo-setting type insulating resin 40 is applied to the transparent substrate 48 over a specified site thereof, and the image sensor chip 41, with its face down, is pressed downward against the resin-applied substrate so as to permit the electrodes 47 to be connected individually to the circuit conductor layers 49. Thereupon, the photo-setting type insulating resin 40 on each circuit conductor layer 49 is wedged away by the corresponding electrode 47 so that the circuit conductor layer 49 and the electrode 47 are electrically connected to each other. Then, a drive signal is externally applied through the circuit conductor layers 49 to determine that the image sensor chip 41 operates in a normal manner. When it is determined that operation is normal, the photo-setting type insulating resin 40 is irradiated with ultraviolet light through the transparent substrate 48 while pressure is continuously applied, the resin being thereby set. If operation is found to be abnormal, the image sensor chip 41 is replaced with a new one and the above described procedure is repeated.

The image sensor of the above described construction operates in such a manner that as optical information is introduced to the photo sensors 43 through the photo-setting type insulating resin 40 and transparent substrate 48, it is converted into an electric signal.

In this embodiment, the material of the transparent substrate 48 is glass; but it is noted that the substrate may be of any other material insofar as the material has light transmission properties.

In FIG. 4, the electrodes 47 are in partially overlapping relation with the elements 42 and photo sensor 43 when viewed in the vertical direction; but it may be noted that since the image sensor chip 41 is pressed against the transparent substrate 48, care should be used to ensure that the elements 42 and photo sensors 47 are positioned in as much less vertically overlapping relation with the electrodes 47 as possible in order to prevent them from possible damage due to excessive load.

Each electrode 47 is formed of aluminum and accordingly its surface is liable to oxide film formation. However, it is noted that each circuit conductor layer 49 is formed of gold admixed with frit. Therefore, such oxide film formed on the electrode surface is removed by the action of the frit during the process of the above mentioned pressure bonding, so that an accurate electric connection can be obtained.

Further, it is noted that each circuit conductor layer 49 is made of gold and costly and accordingly it is of a narrow configuration, whereas each electrode 47 is made of aluminum and inexpensive and accordingly it can be of a broad configuration. This fact permits easy connection between them.

In the present embodiment, as described above, the electrodes 47 of the image sensor chip 41 are brought in abutment against the corresponding circuit conductor layers 49 on the transparent substrate 48. This insures greater ease of working, little or no possibility of electrical disconnection due to mechanical vibrations, and greater performance reliability.

Figure 5A:
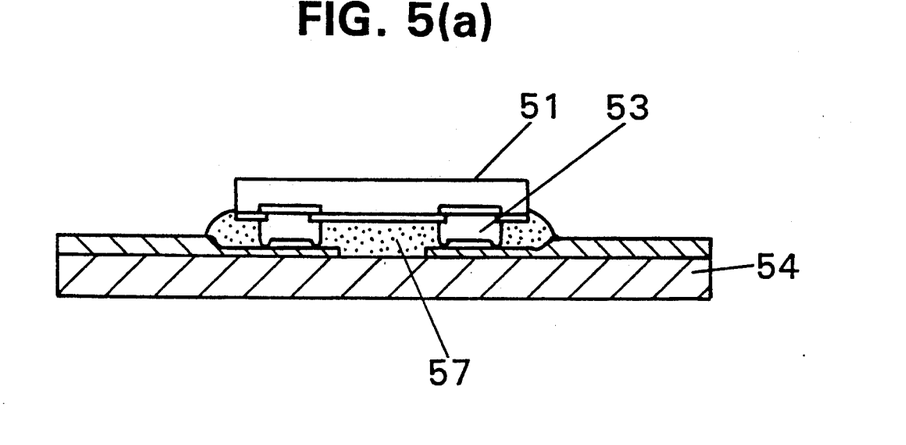
FIGS. 5(a) and 5(b) are, respectively, a side sectional view and a decomposed side sectional view of a fifth embodiment of the invention.
Figure 5B:
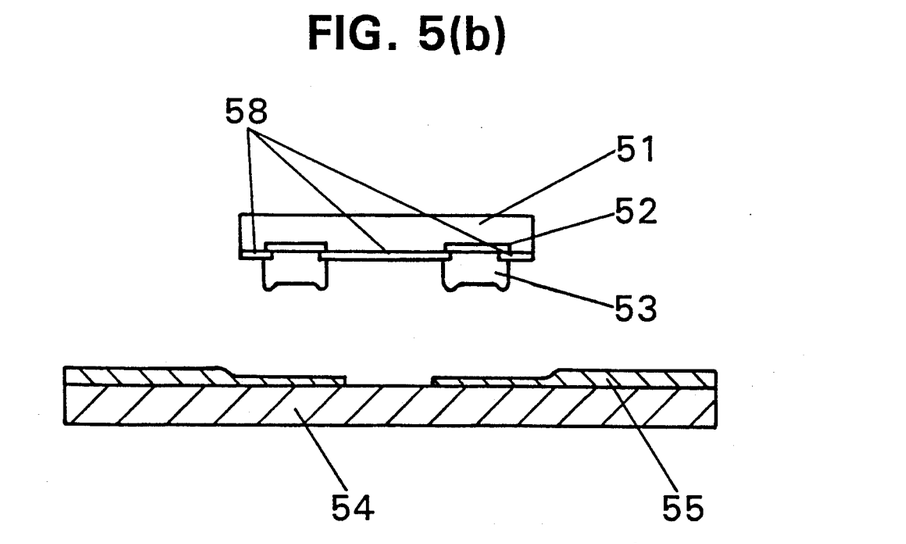

FIG. 5 illustrates another embodiment of the invention which features electrodes 53 of an image sensor chip 51. In FIG. 5, numeral reference 51 designates an image sensor chip; 52 designates second electrodes of aluminum formed on the underside thereof; and 53 designates a first electrode of gold formed on each second electrode 52. Numeral reference 54 designates a transparent substrate for mounting the image sensor chip 51 thereon; 55 designates circuit conductor layers formed on the transparent substrate 54; 57 designates a transparent photo-setting type insulating resin applied between the image sensor chip 51 and the transparent substrate 54 for securely holding them in abutting relation; and 58 designates a protective layer formed on the surface of the image sensor chip 51. It is noted that in this embodiment the first electrodes 53 constitute main elements and, therefore, that no particular mention is made of photo sensors.

A method of manufacturing the image sensor of the above described construction will be explained.

Various elements (not shown) are first formed on a monocrystalline silicon substrate (wafer), then second electrodes 52, each of one hundred and tens of $\mu$m square, by employing the conventional semiconductor process. Next, the monocrystalline silicon substrate is covered for protection with a nitride film of about 1 $\mu$m in thickness which serves as a protective layer 58, over its entire surface other than the portions thereof occupied by the second electrodes 52, in such a manner that the nitride film overlaps the peripheral edge portion of each second electrode 52 over a range of several to ten-odd $\mu$m. A coat of gold is formed on each second electrode 52 to the thickness of several $\mu$m by electroplating or otherwise to provide a first electrode 53. In this case, such coat of gold is formed also on a portion of the second electrode 52 which is covered with the protective layer 58, and accordingly a peripheral edge portion, of several to ten-odd $\mu$m in width, of the first electrode 53 projects upward about in annular fashion. Thereafter, the monocrystalline silicon substrate is cut to length by high-precision dicing to provide an image sensor chip 51. Circuit conductor layers 55 are formed on a transparent substrate 54, e.g., a glass substrate, using noble metal, such as Au or Ag - Pt, and by screen printing or film casting and photolithography. Then, a prescribed amount of photo-setting type insulating resin 57 of the acrylic type is applied to the transparent substrate 54 over a predetermined site thereof by screen printing or by using a dispenser or the like, and the previously fabricated image sensor chip 51 is placed thereon, with the first electrodes 53 downside. The image sensor chip 51 is then subjected to a specified amount of pressure applied from above, so that all the first electrodes 53 on the image sensor chip are brought in abutment with the corresponding circuit conductor layers 55 on the transparent substrate 54. In this case, the annular projection at the apex of each first electrode 53 is crushed for the purpose of absorbing variations in height of the first electrodes 53 and circuit conductor layers 55, as well as all warpage of the image sensor chip 51 and transparent substrate 54. Next, voltage is externally applied through the circuit conductor layers 55 to determine that the image sensor chip 51 operates in a normal manner. Then, ultraviolet light is irradiated through the transparent substrate 54, if the substrate is made of glass, or through clearances present therein, if the substrate is made of aluminum, to set the photo-setting type insulating resin 57, whereupon the required mounting work is completed. In this way, by adopting such a particular arrangement that the peripheral edge portion of each first electrode 53 at its apex projects in an annular fashion, it is possible to increase the surface area of the first electrode 53 to thereby facilitate alignment of the image sensor chip 51 with the transparent substrate 54; and it is further possible to reduce the area of possible crash with respect to the first electrode during the process of mounting and reduce the pressure to be applied during the mounting process, whereby the risk of unreasonable pressure being applied to the image sensor chip 51 and transparent substrate 54 is eliminated which may otherwise result in breakage of the image sensor chip 51 and/or the transparent substrate 54, and whereby improved mounting reliability and improved production yield can be achieved. In the embodiments shown in FIGS. 1 through 5, the transparent substrates 18, 26, 37, 48 and 54 each may be of a flexible one in sheet form.

Figure 6A:
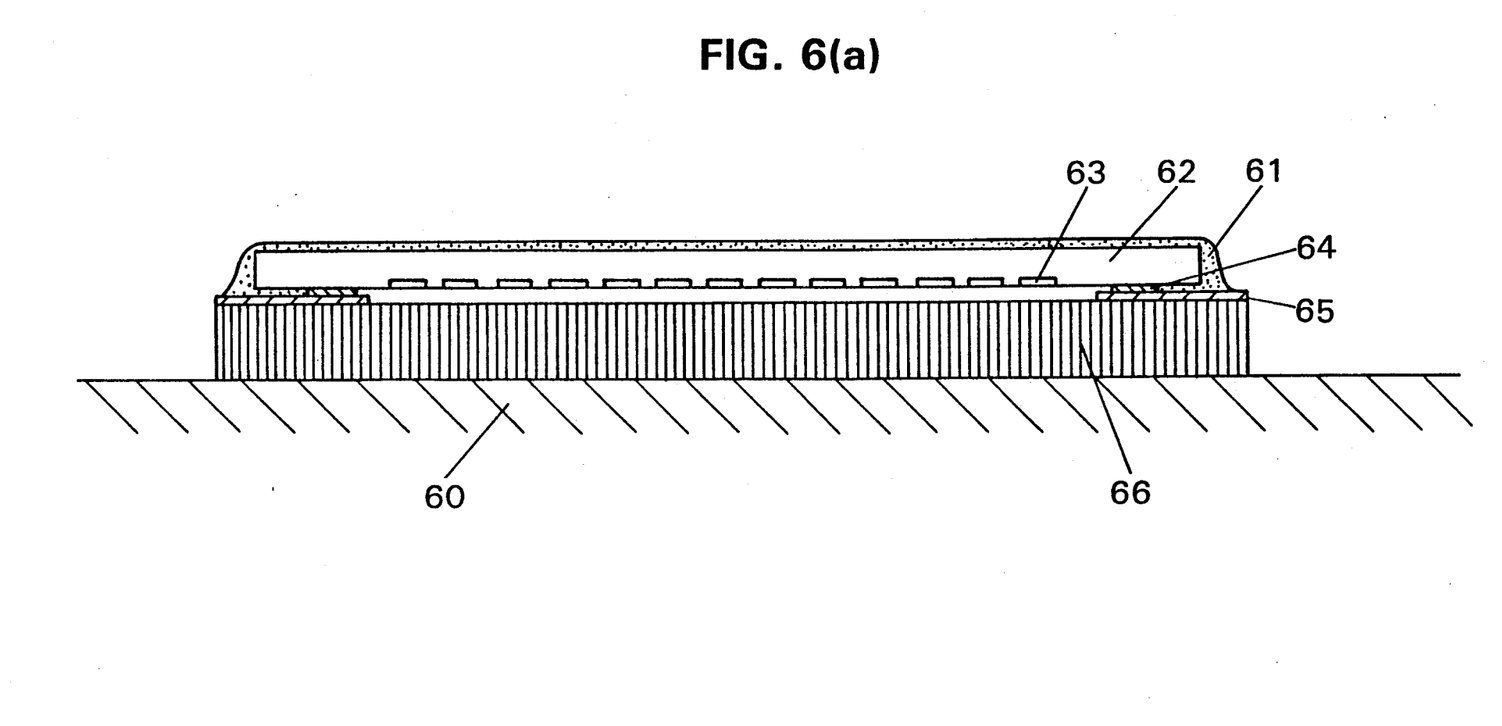
FIGS. 6(a), 6(b) and 6(c) are, respectively, a front sectional view, a partial plan view, and a side sectional view of a sixth embodiment of the invention.
Figure 6B:
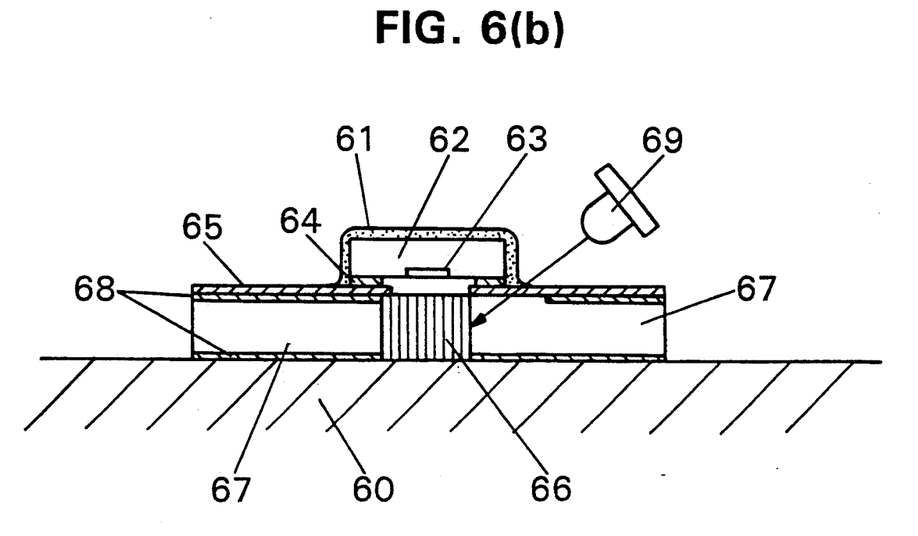
Figure 6C:
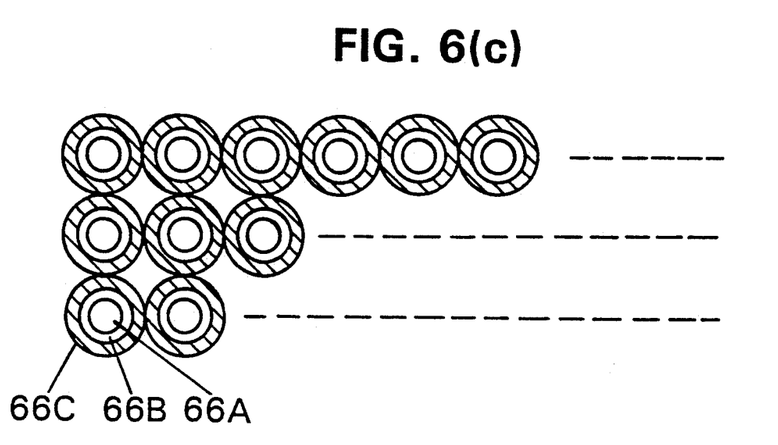

FIGS. 6(a), 6(b) and 6(c) illustrate another embodiment, which features an optical fiber array.

In FIG. 6, numeral reference 61 designates a protective layer; 62 designates an image sensor chip; 63 designates a plurality of photo sensors provided on the image sensor chip 62; and 64 designates electrodes on the image sensor chip 62. Numeral reference 65 designates circuit conductor layers formed on a glass-made transparent substrate 67; and 66 designates an optical fiber array interposed between transparent substrates 67. Numeral reference 68 designates black-color films formed on both the upper side and the underside of each transparent substrate 67; and 69 designates a light source for illuminating a document original 60. FIG. 6(b) is a plan view showing an enlarged portion of the optical fiber array. Each individual optical fiber comprises a core 66A, a clad 66B surrounding the outer surface of the core, a light absorbing portion 66C surrounding the outer surface of the clad 66B.

The image sensor of the above-mentioned construction will be described in more detail.

As shown in FIG. 6(b), a light absorbing portion 66C of 2 to 3 μm in thickness is formed on the outer surface of the clad 66B of an optical fiber having a diameter of about 25 μm. A multiplicity of such optical fibers, as shown in FIG. 6(c), interposed between two transparent substrates 67, are heated at a temperature corresponding to the melting point of glass under pressure applied from opposite sides, whereby an optical fiber array is prepared Next, a black-color film 68 is formed by screen printing on opposite sides of the transparent substrate 67 at a portion other than that through which illumination light transmits. A circuit conductor layer 65 is formed on one end surface of the optical fiber array 66 as well as of the transparent substrate 67, by using a noble metal, such as Au or Ag - Pt, and by screen printing or film casting and photolithography. An image sensor chip 62 having a multiplicity of photo sensors 63, each of 50 to 100 μm square, arranged thereon in parallel at specified intervals (62.5 μm or 125 μm) is mounted in position by face-down bonding so that the photo sensors 63 are brought in bond with one end side of the optical fiber array 66, and so that the electrodes 64 on the image sensor chip 62 are connected to the circuit conductor layer 65 at predetermined positions. Further, silicon or the like resin is applied to the image sensor chip 62 to provide a protective layer 61 for protecting the image sensor chip. In this way, an image sensor is fabricated.

The image sensor is employed in such a manner that an original 60 is brought in contact with the other end side of the optical fiber array 66 and light from the light source (LED array) 69 is allowed to become incident through an upper side region of the transparent substrate 67 which is not formed with a black-color film 68. The light beams transmit through light absorbing portions 66C of individual optical fibers and thus illuminate the original 60 through the optical fibers. For this purpose, the light absorbing portions 66C are of such arrangement that their light absorbance is about 80% to permit some degree of light transmission.

Optical information from the original 60 is conducted to the photo sensors 63 by the multiplicity of optical fibers each having a light absorbing portion 66C in corresponding relation, without involving crosstalk. Any unnecessary external light is cut off 100% by the black-color film 68.

In this way, the embodiment enables image reading with a high degree of resolution (about 80% where MTF value is 4 lp/mm).

As described above, according to the present embodiment, a light absorbing portion 66C is provided on the outer surface of the clad 66B of each optical fiber. This eliminates possible crosstalk of optical information between individual optical fibers, and thus an image sensor capable of reading images with a high degree of resolution is obtained.

INDUSTRIAL APPLICABILITY

As described above, the arrangement according to the invention is such that an image sensor chip having electrodes and photo sensors formed on the underside thereof is bonded through a photo-setting type insulating resin to the upper side of a transparent substrate having circuit conductor layers formed thereon.

Therefore, according to the invention, it is possible to connect the electrodes on the image sensor chip directly with the circuit conductor layers on the transparent substrate so that much higher working efficiency can be obtained as compared with the conventional wiring practice using fine metal wire.

We claim:

1. An image sensor comprising:
   an optical fiber array having first and second ends and comprising a plurality of optical fibers having longitudinal axes perpendicular to said ends;
   a photo element array disposed to face said first end of the optical fiber array and comprising a plurality of photo elements arranged in alignment;
   an upper black-color film disposed around said first end of said optical fiber array to cover the portion other than said first end and a region through which light transmits; and
   a lower black-color film disposed around said second end of said optical fiber array to cover the portion other than said second end in a parallel manner to said second end;
   wherein each of said optical fibers comprises a core, a clad provided on an outer surface of the core, and a light absorbing portion on an outer surface of the clad.

2. An image sensor according to claim 1, wherein said optical fiber array is exposed to said light which radiates through a side of said optical fibers for transmission to the second end of said optical fiber array.

3. An image sensor according to claim 1 wherein said lower black-color film lies perpendicular to the longitudinal axes of said fibers.

* * * * *